(12) United States Patent
Wei

(10) Patent No.: US 11,955,313 B2
(45) Date of Patent: Apr. 9, 2024

(54) CONTROL CIRCUIT, PULSED POWER SUPPLY SYSTEM, AND SEMICONDUCTOR PROCESSING EQUIPMENT

(71) Applicant: BEIJING NAURA MICROELECTRONICS EQUIPMENT CO., LTD., Beijing (CN)

(72) Inventor: Gang Wei, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/786,429

(22) PCT Filed: Dec. 17, 2020

(86) PCT No.: PCT/CN2020/137126
§ 371 (c)(1),
(2) Date: Jun. 16, 2022

(87) PCT Pub. No.: WO2021/121304
PCT Pub. Date: Jun. 24, 2021

(65) Prior Publication Data
US 2023/0023621 A1    Jan. 26, 2023

(30) Foreign Application Priority Data
Dec. 18, 2019  (CN) .......................... 201911310564.4

(51) Int. Cl.
*H02M 3/155*    (2006.01)
*H01J 37/32*    (2006.01)

(52) U.S. Cl.
CPC ....... *H01J 37/32009* (2013.01); *H02M 3/155* (2013.01); *H01J 37/32568* (2013.01); *H01J 2237/327* (2013.01)

(58) Field of Classification Search
None
See application file for complete search history.

(56) References Cited

U.S. PATENT DOCUMENTS 4,695,932 A     9/1987  Higashino
5,159,261 A *  10/1992  Kim .......................... G05F 1/70
                                                                    363/14
(Continued)

FOREIGN PATENT DOCUMENTS

CN         2896644 Y       5/2007
CN       101030706 A       9/2007
(Continued)

OTHER PUBLICATIONS

The World Intellectual Property Organization (WIPO) International Search Report for PCT/CN2020/137126 Mar. 16, 2021 7 Pages (including translation).

*Primary Examiner* — Jeffrey S Zweizig
(74) *Attorney, Agent, or Firm* — ANOVA LAW GROUP, PLLC

(57) ABSTRACT

A control circuit for outputting a pulsed signal includes a switch circuit having a first terminal, a second terminal, a third terminal, a fourth terminal, a first control terminal, and a second control terminal, where the first terminal and the second terminal input the DC signal, the third terminal and the fourth terminal output the pulsed signal, the third terminal and the fourth terminal output the pulsed signal in response to the first control terminal and the second control terminal receiving the first signal, and stop outputting the pulsed signal in response to the first control terminal and the second control terminal receiving the second signal; and an (Continued)

energy storage circuit having two terminals connected to the first terminal and the second terminal of the switch circuit to store residual electric energy of the switch circuit when the switch circuit does not output the pulsed signal.

19 Claims, 11 Drawing Sheets

(56) References Cited

U.S. PATENT DOCUMENTS

| | | | | |
|---|---|---|---|---|
| 6,538,909 | B2* | 3/2003 | Goodarzi | H02M 1/10 363/17 |
| 7,099,169 | B2* | 8/2006 | West | H02M 7/5387 323/222 |
| 7,336,059 | B2* | 2/2008 | Steigerwald | H01F 6/006 323/225 |
| 7,433,209 | B2* | 10/2008 | Chan | H02M 3/33569 363/21.02 |
| 7,811,941 | B1* | 10/2010 | Becker | H01L 21/3065 438/719 |
| 10,720,505 | B2* | 7/2020 | Then | H01L 29/6684 |
| 11,336,189 | B2* | 5/2022 | Parsa | H02M 3/01 |
| 11,387,741 | B2* | 7/2022 | Sayre | B60L 53/52 |
| 11,496,042 | B2* | 11/2022 | Krause | H02M 1/32 |
| 2010/0101935 | A1 | 4/2010 | Chistyakov et al. | |
| 2012/0025726 | A1 | 2/2012 | Watanabe et al. | |

FOREIGN PATENT DOCUMENTS

| | | |
|---|---|---|
| CN | 202455288 U | 9/2012 |
| CN | 103546057 A | 1/2014 |
| CN | 103546057 B | 8/2016 |
| CN | 106787928 A | 5/2017 |
| CN | 109510504 A | 3/2019 |
| CN | 110198138 A | 9/2019 |
| CN | 110993478 A | 4/2020 |
| EP | 1376868 A2 | 1/2004 |
| EP | 1376868 A3 | 11/2005 |
| EP | 2187521 A2 | 5/2010 |
| JP | H03102278 A | 4/1991 |
| JP | 2012033409 A | 2/2012 |
| JP | 2018535504 A | 11/2018 |
| KR | 20120012761 A | 2/2012 |
| KR | 20180052772 A | 5/2018 |

* cited by examiner

CONTROL CIRCUIT, PULSED POWER SUPPLY SYSTEM, AND SEMICONDUCTOR PROCESSING EQUIPMENT

CROSS-REFERENCE TO RELATED APPLICATIONS

This application is a national phase stage application of International Patent Application PCT/CN2020/137126, filed on Dec. 17, 2020, which claims priority to Chinese Patent Application No. 201911310564.4, filed on Dec. 18, 2019, the entire contents of all of which are incorporated herein by reference.

TECHNICAL FIELD

The present disclosure relates to the technical field of semiconductor manufacturing technologies and, more particularly, to a control circuit, a pulsed power system, and a semiconductor processing equipment.

BACKGROUND

With the rapid development of electronic technology, users demand higher and higher integration density of integrated circuits, which requires constant improvement of processing accuracy of semiconductor wafer. Plasma devices are widely used in processes of manufacturing the integrated circuits or micro-electromechanical systems (MEMS) devices. As such, research and development of plasma generating equipment for processes such as etching, deposition, or ion implantation is crucial for the improvement of semiconductor manufacturing processes and facilities.

Currently, controlling plasma energy and density is important for semiconductor processes. Existing methods of controlling the plasma energy and density control the plasma energy and density through controlling the voltage applied to the load. However, inductors are often included in the integrated circuits. The inductors continue to release residual energy onto a load circuit after the load voltage is turned off, thereby causing oscillation. The oscillation makes it difficult to accurately control the plasma energy and density.

SUMMARY

The present disclosure aims to solve at least one of the technical problems in the existing technology, and provides a control circuit, a pulsed power supply system, and semiconductor processing equipment, which stores residual electric energy in a switch circuit, thereby reducing oscillation of the voltage at the end of each pulse, and improving an accuracy of controlling the plasma energy and density used in the semiconductor process.

To achieve the above objectives, one aspect of the present disclosure provides a control circuit for outputting a direct current (DC) signal in the form of a pulsed signal. The control circuit includes: a switch circuit having a first terminal, a second terminal, a third terminal, a fourth terminal, a first control terminal, and a second control terminal, wherein the first terminal and the second terminal are input terminals of the DC signal, the third terminal and the fourth terminal are output terminals of the pulsed signal, the first control terminal and the second control terminal receive a first signal or a second signal to control outputting the pulsed signal, in response to the first control terminal and the second control terminal receiving the first signal, the third terminal and the fourth terminal output the pulsed signal, and in response to the first control terminal and the second control terminal receiving the second signal, the third terminal and the fourth terminal stop outputting the pulsed signal; and an energy storage circuit having two terminals connected to the first terminal and the second terminal of the switch circuit to store residual electric energy of the switch circuit when the switch circuit does not output the pulsed signal.

In some embodiments, the switch circuit includes a first switch component and a second switch component. A first terminal and a second terminal of the first switch component and a first terminal and a second terminal of the second switch component are used as input terminals for the DC signal. The first terminal of the first switch component is connected to the first terminal of the energy storage circuit and the first terminal of the second switch component, respectively. The second terminal of the first switch component is connected to the second terminal of the energy storage circuit and the second terminal of the second switch component, respectively. A control terminal of the first switch component and a control terminal of the second switch component are configured to receive the first signal or the second signal. A third terminal of the first switch component and a third terminal of the second switch component are used for outputting the pulsed signal. In response to the control terminal of the first switch component receiving the first signal, the first switch component is configured to turn on a circuit between the first terminal of the first switch component and the third terminal of the first switch component, and to turn off a circuit between a second terminal of the energy storage circuit and the third terminal of the first switch component. In response to the control terminal of the first switch component receiving the second signal, the first switch component is configured to turn off the circuit between the first terminal of the first switch component and the third terminal of the first switch component, and to turn on the circuit between the second terminal of the energy storage circuit and the third terminal of the first switch component. In response to the control terminal of the second switch component receiving the first signal, the second switch component is configured to turn on a circuit between the second terminal of the second switch component and the third terminal of the second switch component, and to turn off a circuit between a first terminal of the energy storage circuit and the third terminal of the second switch component. In response to the control terminal of the second switch component receiving the second signal, the second switch component is configured to turn off the circuit between the second terminal of the second switch component and the third terminal of the second switch component, and to turn on the circuit between the first terminal of the energy storage circuit and the third terminal of the second switch component.

In some embodiments, the first switch component includes a first switch transistor and a first cut-off diode. An input terminal of the first switch transistor and an input terminal of the first cut-off diode are used as the input terminals for the DC signal. The input terminal of the first switch transistor is connected to the first terminal of the energy storage circuit. The input terminal of the first cut-off diode is connected to the second terminal of the energy storage circuit. An output terminal of the first switch transistor is connected to an output terminal of the first cut-off diode for outputting the pulsed signal. A control terminal of the first switch transistor is configured to receive the first signal or the second signal. In response to the control terminal of the first switch transistor receiving the first signal, the first switch transistor is configured to turn on a circuit between the input terminal and the output terminal of the first switch transistor, and the first cut-off diode is configured to turn off a circuit between the second terminal of the energy storage circuit and the output terminal of the first cut-off diode. In response to the control terminal of the first switch transistor receiving the second signal, the first switch transistor is configured to turn off the circuit between the input terminal and the output terminal of the first switch transistor, and the first cut-off diode is configured to turn on the circuit between the second terminal of the energy storage circuit and the output terminal of the first cut-off diode.

In some embodiments, material used for the first switch transistor includes any one of Si, SiC, GaN, and AlGaN.

In some embodiments, the second switch component includes a second switch transistor and a second cut-off diode. An input terminal of the second switch transistor is connected to an input terminal of the first cut-off diode for outputting the pulsed signal. An output terminal of the second switch transistor and an output terminal of the second cut-off diode are used as the input terminals for the DC signal. The output terminal of the second switch transistor is connected to the second terminal of the energy storage circuit. The output terminal of the second cut-off diode is connected to the first terminal of the energy storage circuit. A control terminal of the second switch transistor is configured to receive the first signal or the second signal. In response to the control terminal of the second switch transistor receiving the first signal, the second switch transistor is configured to turn on a circuit between the input terminal and the output terminal of the second switch transistor, and the second cut-off diode is configured to turn off a circuit between the first terminal of the energy storage circuit and the output terminal of the second cut-off diode. In response to the control terminal of the second switch transistor receiving the second signal, the second switch transistor is configured to turn off the circuit between the input terminal and the output terminal of the second switch transistor, and the second cut-off diode is configured to turn on the circuit between the first terminal of the energy storage circuit and the output terminal of the second cut-off diode.

In some embodiments, material used for the second switch transistor includes any one of Si, SiC, GaN, and AlGaN.

In some embodiments, the energy storage circuit includes at least one capacitor and/or at least one inductor. One terminal of the at least one capacitor and/or the at least one inductor is used as the first terminal of the energy storage circuit to connect to the first terminal of the switch circuit. Another terminal of the at least one capacitor and/or the at least one inductor is used as the second terminal of the energy storage circuit to connect to the second terminal of the switch circuit.

In some embodiments, the control circuit further includes a transformer including a primary inductor and a secondary inductor, wherein two terminals of the primary inductor are connected to the third terminal and the fourth terminal of the switch circuit, respectively, and two terminals of the secondary inductor are configured to output the pulsed signal.

In some embodiments, the control circuit further includes a control component configured to send the first signal or the second signal to the first control terminal and the second control terminal of the switch circuit.

Another aspect of the present disclosure provides a pulsed power supply system. The pulsed power supply system includes a DC circuit and the disclosed control circuit. The DC circuit is configured to supply the DC signal to the first terminal and the second terminal of the switch circuit.

In some embodiments, the DC circuit includes a DC power supply.

Another aspect of the present disclosure provides semiconductor processing equipment. The semiconductor processing equipment incudes an upper electrode assembly; a lower electrode assembly; and at least one disclosed pulsed power supply system, configured to supply the pulsed signal to at least one of the upper electrode assembly or the lower electrode assembly.

In some embodiments, the semiconductor processing equipment includes plasma immersion implantation equipment, physical vapor deposition equipment, or plasma etching equipment.

The embodiments of the present disclosure provide the following beneficial effects.

In the control circuit provided by the embodiments of the present disclosure, the switch circuit outputs the pulsed signal in response to the first control terminal and the second control terminal receiving the first signal, and stops outputting the pulsed signal in response to the first control terminal and the second control terminal receiving the second signal. At the same time, the energy storage circuit stores the residual electric energy in the switch circuit when the switch circuit does not output the pulsed signal, thereby reducing the time period that the residual electric energy continues to circulate in the switch circuit, reducing the voltage of the oscillation occurred at the end of each pulse, and improving the accuracy of controlling the plasma energy and density used in the semiconductor processes.

The pulsed power supply system provided by the present disclosure outputs the pulsed signal and stores the residual electric energy in the switch circuit through the control circuit, thereby reducing the oscillation of the voltage at the end of each pulse and improving the accuracy of controlling the plasma energy and density used in the semiconductor processes.

The semiconductor processing equipment provided by the present disclosure supplies the pulsed signal to at least one of the upper electrode assembly or the lower electrode assembly and stores the residual electric energy in the switch circuit through the pulsed power supply system, thereby reducing the oscillation of the voltage at the end of each pulse and improving the accuracy of controlling the plasma energy and density used in the semiconductor processes.

DETAILED DESCRIPTION OF THE EMBODIMENTS

The following specific embodiments are used to illustrate various features of the present disclosure. Those who are familiar with the technology can easily understand other advantages and effects of the present disclosure from contents disclosed in the specification. The embodiments described herein are some and not all embodiments of the present disclosure. Based on the embodiments of the present disclosure, other embodiments obtained by those of ordinary skill in the art without creative efforts shall fall within the protection scope of the present disclosure.

One aspect of the present disclosure provides a control circuit. The control circuit outputs a direct current (DC) signal in the form of a pulsed signal. Three embodiments of the control circuit consistent with the present disclosure are described in detail below.

First Embodiment

Figure 1:
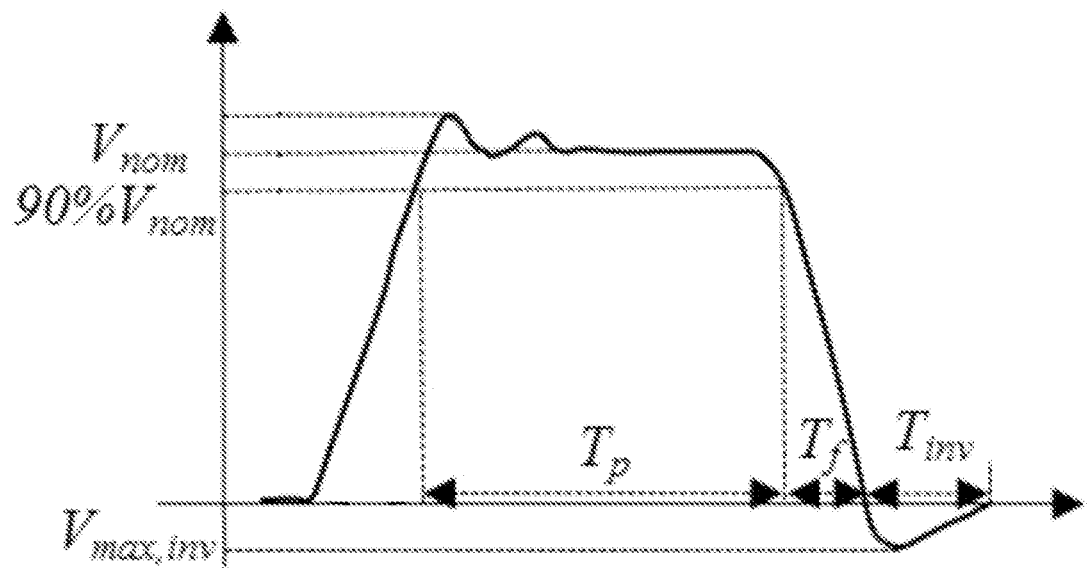
FIG. 1 is a schematic pulse waveform diagram obtained from an existing control circuit.

The control circuit outputs the DC signal in the form of the pulsed signal. The DC signal may be a voltage signal or a current signal. For example, the DC signal can be outputted by a DC power supply in the form of the pulsed signal and can be applied to the load circuit. However, because there is an inductor in the control circuit, for example, a conductor wire, residual energy may be generated at an end of each pulse. The residual energy continues to circulate in the control circuit, thereby causing voltage oscillation at the end of each pulse. FIG. 1 is a schematic pulse waveform diagram obtained from an existing control circuit. As shown in FIG. 1, Tp is a time period for a pulsed voltage signal to reach a normal voltage Vnom. Tf is a time period for the pulsed voltage signal to drop from the normal value to zero, that is, a falling edge time period of the pulse waveform. Tiny is a time period of the voltage oscillation occurred at the end of the pulse. Vmax,inv is a maximum voltage during Tiny of the voltage oscillation. Because of a presence of Tiny of the voltage oscillation, it is difficult to accurately control the plasma energy and density.

Figure 2A:
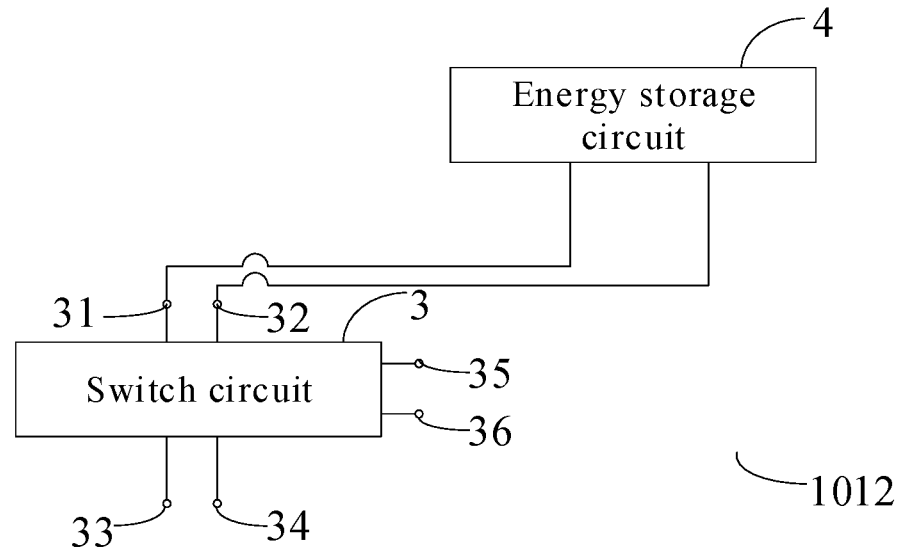
FIG. 2A is a schematic block diagram of a control circuit according to some embodiments of the present disclosure.

FIG. 2A is a schematic block diagram of a control circuit according to some embodiments of the present disclosure. To solve the oscillation problem, the present disclosure provides the control circuit 1012 configured to output the DC signal in the form of the pulsed signal, as shown in FIG. 2A. The DC signal can be a voltage signal or a current signal. In some embodiments, the control circuit 1012 includes a switch circuit 3 and an energy storage circuit 4. The switch circuit 3 includes a first terminal 31, a second terminal 32, a third terminal 33, a fourth terminal 34, a first control terminal 35, and a second control terminal 36. The first terminal 31 and the second terminal 32 are input terminals of the DC signal. For example, a DC signal output device such as a DC power supply can apply the DC signal to the first terminal 31 and the second terminal 32. The third terminal 33 and the fourth terminal 34 are configured to be output terminals of the pulsed signal. The first control terminal 35 and the second control terminal 36 are configured to receive a first signal or a second signal to control outputting the pulsed signal. In response to the first control terminal 35 and the second control terminal 36 receiving the first signal, the third terminal 33 and the fourth terminal 34 output the pulsed signal. In response to the first control terminal 35 and the second control terminal 36 receiving the second signal, the third terminal 33 and the fourth terminal 34 stops outputting the pulsed signal.

Two terminals of the energy storage circuit 4 are connected to the first terminal 31 and the second terminal 32 of the switch circuit 3. When the switch circuit 3 does not output the pulsed signal, the energy storage circuit 4 stores residual electric energy in the switch circuit 3. The residual electric energy includes, but is not limited to, electric energy generated by an inductor component such as a conductor wire in the switch circuit 3. The energy storage circuit 4 stores the residual electric energy in the switch circuit 4 when the switch circuit 3 does not output the pulsed signal, thereby reducing a time period that the residual electric energy continues to circulate in the switch circuit 3. Thus, a voltage of the oscillation occurred at the end of each pulse is reduced, and plasma energy and density used in semiconductor processes can be accurately controlled.

Figure 2B:
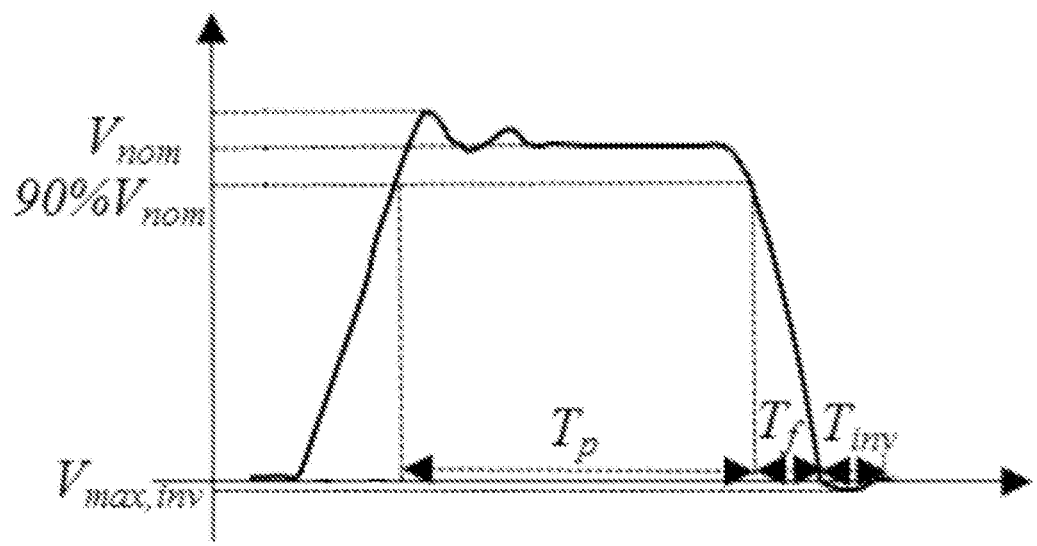
FIG. 2B is a schematic pulse waveform diagram obtained from the control circuit according to some embodiments of the present disclosure.

FIG. 2B is a schematic pulse waveform diagram obtained from the control circuit according to some embodiments of the present disclosure. Compared to the pulse waveform obtained from the existing control circuit in FIG. 1, the falling edge time period Tf of the pulse waveform obtained form the embodiment of the present disclosure is reduced, the voltage oscillation time period Tiny at the end of the pulse is substantially reduced, and the maximum voltage Vmax,inv during the voltage oscillation time period is also effectively reduced. Through lab testing, in the pulse waveform obtained from the control circuit 1012 consistent with the present disclosure, the maximum voltage Vmax,inv is smaller than 10% of the normal voltage of the pulse waveform, the time period of the voltage oscillation is smaller than 1 μs, and the falling edge time period Tf is smaller than 1 μs. Thus, the pulse waveform of the control circuit 1012 is more desirable, thereby improving the control accuracy of the plasma energy and density used in the semiconductor processes.

Figure 2C:
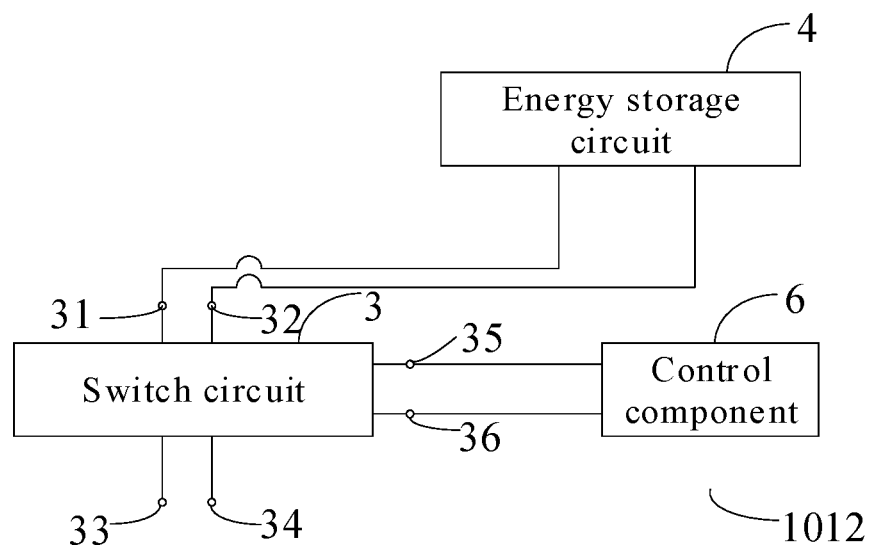
FIG. 2C is another schematic block diagram of the control circuit according to some embodiments of the present disclosure.

In some embodiments, as shown in FIG. 2C, the control circuit 1012 further includes a control component 6. Two terminals of the control component 6 are connected to the first control terminal 35 and the second control terminal 36 of the switch circuit 3. The control component 6 is configured to send the first signal or the second signal to the first control terminal 35 and the second control terminal 36 of the switch circuit 3 to control outputting the pulsed signal.

Figure 3A:
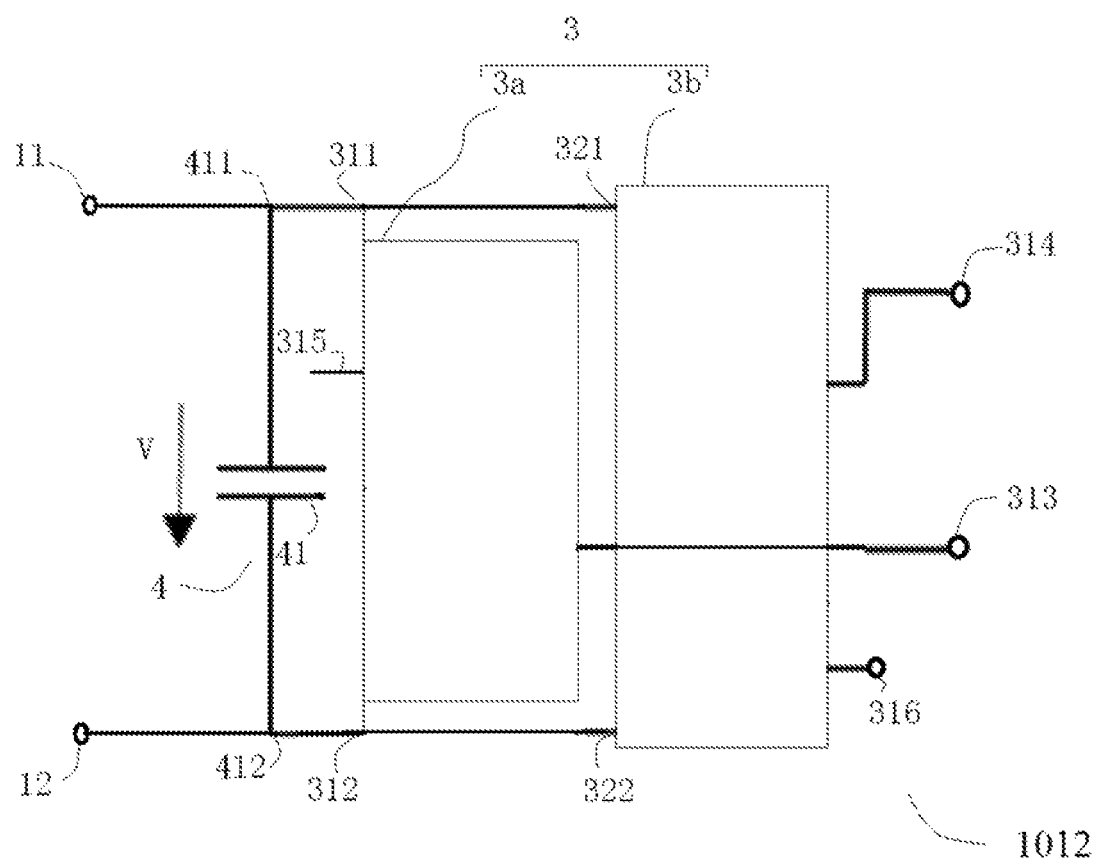
FIG. 3A is a schematic circuit diagram of the control circuit according to some embodiments of the present disclosure.

In some embodiments, as shown in FIG. 3A, the switch circuit 3 includes a first switch component 3a and a second switch component 3b. A first terminal 311 and a second terminal 312 of the first switch component 3a and a first terminal 321 and a second terminal 322 of the second switch component 3b are input terminals of the DC signal. For example, two input terminals 11 and 12 are shown in FIG. 3A. The first terminal 311 of the first switch component 3a and the first terminal 321 of the second switch component 3b are connected to the input terminal 11. The second terminal 312 of the first switch component 3a and the second terminal 322 of the second switch component 3b are connected to the input terminal 12. Through the two input terminals 11 and 12, the DC signal is applied to the first terminal 311 and the second terminal 312 of the first switch component 3a and the first terminal 321 and the second terminal 322 of the second switch component 3b.

The first terminal 311 of the first switch component 3a is connected to a first terminal 411 of the energy storage circuit 4 and the first terminal 321 of the second switch component 3b, respectively. The second terminal 312 of the first switch component 3a is connected to a second terminal 412 of the energy storage circuit 4 and the second terminal 322 of the second switch component 3b. A control terminal 315 of the first switch component 3a and a control terminal 316 of the second switch component 3b are configured to receive the first signal or the second signal. A third terminal 313 of the first switch component 3a and a third terminal 314 of the second switch component 3b are configured to output the pulsed signal.

When the control terminal 315 of the first switch component 3a receives the first signal, the first switch component 3a is configured to turn on a circuit between the first terminal 311 of the first switch component 3a and the third terminal 313 of the first switch component 3a, and to turn off a circuit between the second terminal 412 of the energy storage circuit 4 and the third terminal 313 of the first switch component 3a. When the control terminal 316 of the second switch component 3b receives the first signal, the second switch component 3b is configured to turn on a circuit between the second terminal 322 of the second switch component 3b and the third terminal 314 of the second switch component 3b, and to turn off a circuit between the first terminal 411 of the energy storage circuit 4 and the third terminal 314 of the second switch component 3b. At this point, through the input terminals 11 and 12, the DC signal is applied to the first terminal 311 of the first switch component 3a and the first terminal 321 of the second switch component 3b, respectively, and is outputted through the third terminal 313 of the first switch component 3a and the third terminal 314 of the second switch component 3b.

When the control terminal 315 of the first switch component 3a receives the second signal, the first switch component 3a is further configured to turn off the circuit between the first terminal 311 of the first switch component 3a and the third terminal 313 of the first switch component 3a, and to turn on the circuit between the second terminal 412 of the energy storage circuit 4 and the third terminal 313 of the first switch component 3a. When the control terminal 316 of the second switch component 3b receives the second signal, the second switch component 3b is further configured to turn off the circuit between the second terminal 322 of the second switch component 3b and the third terminal 314 of the second switch component 3b, and to turn on a circuit between the first terminal 411 of the energy storage circuit 4 and the third terminal 314 of the second switch component 3b. At this point, through the input terminals 11 and 12, the DC signal is applied to the first terminal 311 of the first switch component 3a and the first terminal 321 of the second switch component 3b, respectively, but cannot be outputted through the third terminal 313 of the first switch component 3a and the third terminal 314 of the second switch component 3b. Thus, the switch circuit 3 stops outputting the pulsed signal.

Figure 3B:
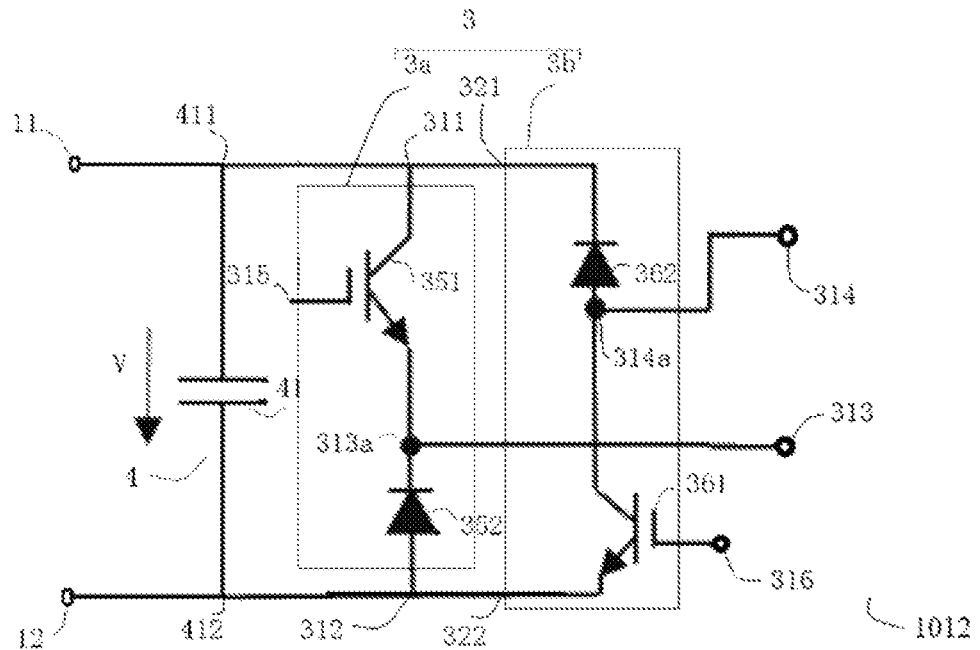
FIG. 3B is another schematic circuit diagram of the control circuit according to some embodiments of the present disclosure.

The first switch component 3a may have various structures. In some embodiments, referring to FIG. 3B, the first switch component 3a includes a first switch transistor 351 and a first cut-off diode 352. An input terminal of the first switch transistor 351 as the first terminal 311 of the first switch component 3a and an input terminal of the first cut-off diode 352 as the second terminal 312 of the first switch component 3a are configured to be the input terminals for receiving the DC signal. In addition, the input terminal of the first switch transistor 351 is connected to the first terminal 411 of the energy storage circuit 4. The input terminal of the first cut-off diode 352 is connected to the second terminal 412 of the energy storage circuit 4. An output terminal of the first switch transistor 351 is connected to an output terminal of the first cut-off diode 352, and both output terminals are, for example, connected at a connection point 313a as shown in FIG. 3B. An output terminal drawn from the connection point 313a is used as the third terminal 313 of the first switch component 3a for outputting the pulsed signal. The control terminal of the first switch transistor 351 is used as the control terminal 315 of the first switch component 3a for receiving the first signal or the second signal.

After the control terminal 315 receives the first signal, the first switch transistor 351 is configured to turn on the circuit between the input terminal and the output terminal of the first switch transistor 351, that is, turn on the circuit between the first terminal 311 and the third terminal 313 of the first switch component 3a. The first cut-off diode 352 is configured to turn off the circuit between the second terminal 412 of the energy storage circuit 4 and the output terminal of the first cut-off diode 352, that is, turn off the circuit between the second terminal 412 of the energy storage circuit 4 and the third terminal 313 of the first switch component 3a. On the contrary, after the control terminal 315 receives the second signal, the first switch transistor 351 is configured to turn off the circuit between the input terminal and the output terminal of the first switch transistor 351, that is, turn off the circuit between the first terminal 311 and the third terminal 313 of the first switch component 3a. The first cut-off diode 352 is configured to turn on the circuit between the second terminal 412 of the energy storage circuit 4 and the output terminal of the first cut-off diode 352, that is, turn on the circuit between the second terminal 412 of the energy storage circuit 4 and the third terminal 313 of the first switch component 3a.

In some embodiments, the material used for the first switch transistor 351 includes any one of Si, SiC, GaN, and AlGaN.

The second switch component 3b can have various structures. In some embodiments, referring to FIG. 3B, the second switch component 3b includes a second switch transistor 361 and a second cut-off diode 362. An input terminal of the second switch transistor 361 is connected to an input terminal of the second cut-off diode 362, and both input terminals are, for example, connected at a connection point 314a as shown in FIG. 3B. An output terminal drawn from the connection point 314a is used as the third terminal 314 of the second switch component 3b for outputting the pulsed signal.

An output terminal of the second switch transistor 361 is used as the second terminal 322 of the second switch component 3b, an output of the second cut-off diode 362 is used as the first terminal 321 of the second switch component 3b, and both output terminals are used as an input terminal of the DC signal. The output terminal of the second switch transistor 361 is connected to the second terminal 412 of the energy storage circuit 4. The output terminal of the second cut-off diode 363 is connected to the first terminal 411 of the energy storage circuit 4. A control terminal of the second switch transistor 361 is used as the control terminal 316 of the second switch component 3b for receiving the first signal or the second signal.

After the control terminal 316 receives the first signal, the second switch transistor 361 is configured to turn on a circuit between the input terminal and the output terminal of the second switch transistor 361, that is, turn on the circuit between the second terminal 322 and the third terminal 314 of the second switch component 3b. The second cut-off diode 362 is configured to turn off a circuit between the first terminal 411 of the energy storage circuit 4 and the output terminal of the second cut-off diode 362, that is, turn off the circuit between the first terminal 411 of the energy storage circuit 4 and the third terminal 314 of the second switch component 3b. On the contrary, after the control terminal 316 receives the second signal, the second switch transistor 361 is configured to turn off the circuit between the input terminal and the output terminal of the second switch transistor 361, that is, turn off the circuit between the second terminal 322 and the third terminal 314 of the second switch component 3b. The second cut-off diode 362 is configured to turn on the circuit between the first terminal 411 of the energy storage circuit 4 and the output terminal of the second cut-off diode 362, that is, turn on the circuit between the first terminal 411 of the energy storage circuit 4 and the third terminal 314 of the second switch component 3b.

In some embodiments, the material used for the second switch transistor 361 includes any one of Si, SiC, GaN, and AlGaN.

In some embodiments, the first switch transistor 351 and the second switch transistor 361 both are switch components such as triodes.

Figure 4:
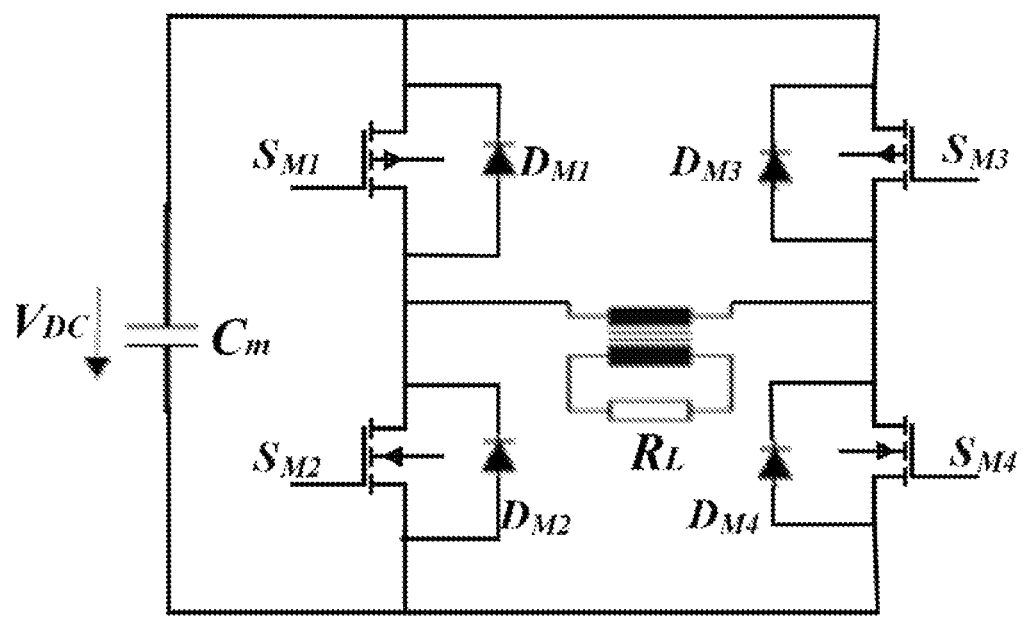
FIG. 4 is a schematic circuit diagram of a control circuit comparing with the control circuit in FIG. 3B according to some embodiments of the present disclosure.

FIG. 4 is a schematic circuit diagram of a control circuit comparing with the control circuit in FIG. 3B according to some embodiments of the present disclosure. As shown in FIG. 4, the control circuit is configured to output the pulsed signal (e.g., the pulsed DC voltage Vdc) and to apply the pulsed signal to a load (RL) through a transformer. In some embodiments, the control circuit is a full-bridge circuit, which includes two pairs of switch transistors, that is, a first pair of switch transistors (SM1, SM4) and a second pair of switch transistors (SM2, SM3). In theory, when the pulsed DC voltage Vdc is applied to the load RL, an electric current passes through two branches where the first pair of switch transistors (SM1, SM4) and the second pair of switch transistors (SM2, SM3) are located respectively, thereby applying the pulsed signal to the load RL.

The present disclosure provides another control circuit 1012. The control circuit 1012 includes a first switch transistor 351, a first cut-off diode 352, a second switch transistor 361, and a second cut-off diode 362 to control the turn-on or turn-off of corresponding circuits. Compared to the control circuit shown in FIG. 4, the control circuit 1012 is not a full bridge circuit, and does not reply on the switch transistors to apply a voltage to a load. Because the first switch transistor 351 and the second switch transistor 361 both are switch components such as triodes having substantially high response speed, the control circuit 1012 further avoid occurrence of circuit overcurrent and other symptoms in addition to satisfying the requirement of the response speed. Thus, reliability is improved.

In some embodiments, the energy storage circuit 4 includes a capacitor 41. Two terminals of the capacitor 41 are the first terminal 411 and the second terminal 412 of the energy storage circuit 4. The capacitor 41 is capable of storing the residual electric energy from the switch circuit 3.

In some embodiments, the energy storage circuit 4 includes one capacitor 41. But the present disclosure is not limited thereto. In practical applications, the energy storage circuit 4 may include multiple capacitors, may further include at least one inductor, or may include at least one capacitor and at least one inductor, as long as the residual electric energy can be stored. In some embodiments, one end of a capacitor and/or an inductor is used as the first terminal 411 and is connected to the first terminal 31 of the switch circuit 3, another end of is used as the second terminal 412 of the energy storage circuit 4 and is connected to the second terminal 32 of the switch circuit 3.

In the control circuit 1012 consistent with the embodiments of the present disclosure, the switch circuit 3 outputs the pulsed signal in response to receiving the first signal at the first control terminal 35 and the second control terminal 36, and stops outputting the pulsed signal in response to receiving the second signal at the first control terminal 35 and the second control terminal 36, thereby achieving outputting the DC signal in the formed of the pulsed signal. At the same time, the energy storage circuit 4 stores the residual electric energy in the switch circuit 3 when the switch circuit 3 does not output the pulsed signal. Thus, the time period for the residual electric energy to continue to circulate in the switch circuit 3 is reduced, the oscillation of the voltage at the end of each pulse is reduced, and the plasma energy and density used in the semiconductor processes can be accurately controlled.

Second Embodiment

Figure 5A:
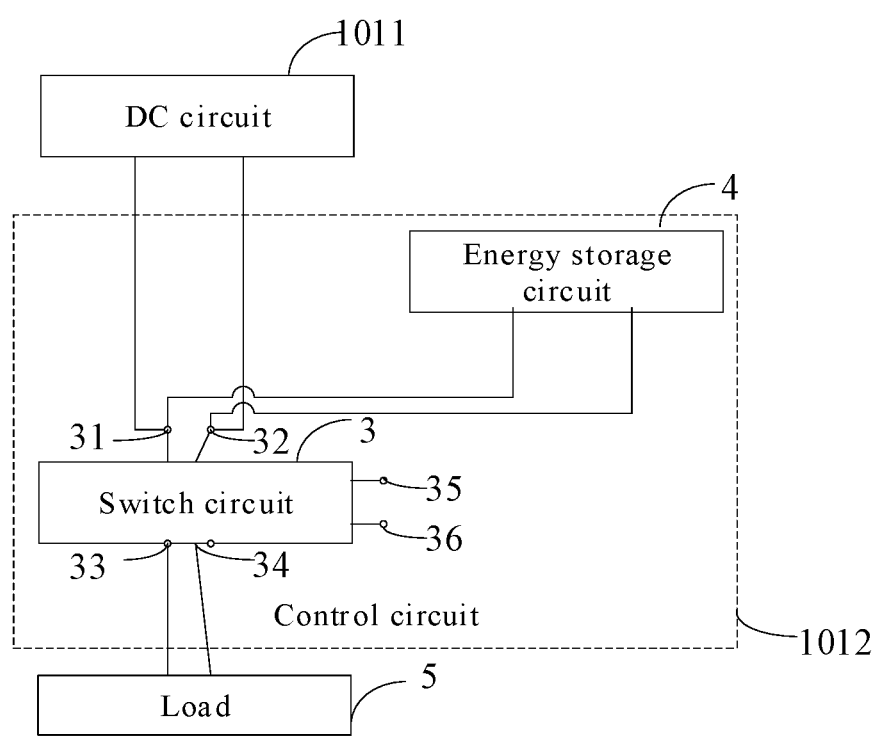
FIG. 5A is a schematic block diagram of another control circuit according to some embodiments of the present disclosure.

The control circuit 1012 provided by the second embodiment is based on the first embodiment. FIG. 5A is a schematic block diagram of another control circuit according to some embodiments of the present disclosure. In some embodiments, as shown in FIG. 5A, the control circuit 1012 is configured to convert a DC signal outputted from a DC circuit 1011 into a pulsed signal, and to apply the pulsed signal to a load 5. The load 5 may be a base for carrying a substrate in a semiconductor processing equipment, especially a plasma semiconductor processing equipment. In some embodiments, in practical applications, the load 5 may also be a device requiring the DC signal in a pulse form in other semiconductor processing equipment, for example, a target material and the base in a physical vapor deposition equipment. In some embodiments, in practical application, the device capable of outputting the DC signal is not limited to a DC power supply, and can also be any other device capable of outputting the DC signal.

In some embodiments, as shown in FIG. 5A, the first terminal 31 and the second terminal 32 of the switch circuit 3 are connected to two terminals of the DC circuit 1011, respectively, and are configured to apply the DC signal outputted from the DC circuit 1011. The DC circuit 3 is the DC power supply. The third terminal 33 and the fourth terminal 34 of the switch circuit 3 are connected to two terminals of the load 5, respectively, and are configured to output the pulsed signal and apply to the two terminals of the load 5. The first control terminal 35 and the second control terminal 36 of the switch circuit 3 are configured to receive the first signal or the second signal. The two terminals of the energy storage circuit 4 are connected to the first terminal 31 and the second terminal 32 of the switch circuit 3.

After the first control terminal 35 and the second control terminal 36 receive the first signal, the third terminal 33 and the fourth terminal 34 of the switch circuit 3 output the pulsed signal, and apply the pulsed signal to the load 5. After the first control terminal 35 and the second control terminal 36 receive the second signal, the third terminal 33 and the fourth terminal 34 of the switch circuit 3 stop outputting the pulsed signal. At this point, the DC signal outputted from the DC circuit 1011 cannot be applied to the load 5, and at the same time, the energy storage circuit 4 is able to store the residual electric energy in the switch circuit 3. The residual electric energy includes, but is not limited to, the electric energy generated from the inductor component in the switch circuit 3. Through storing the residual electric energy of the switch circuit 3 in the energy storage circuit 4, the time period for the residual electric energy to continue to circulate in the switch circuit 3 is reduced, the oscillation of the voltage at the end of each pulse is reduced, and the plasma energy and density used in the semiconductor processes can be accurately controlled.

Figure 5B:
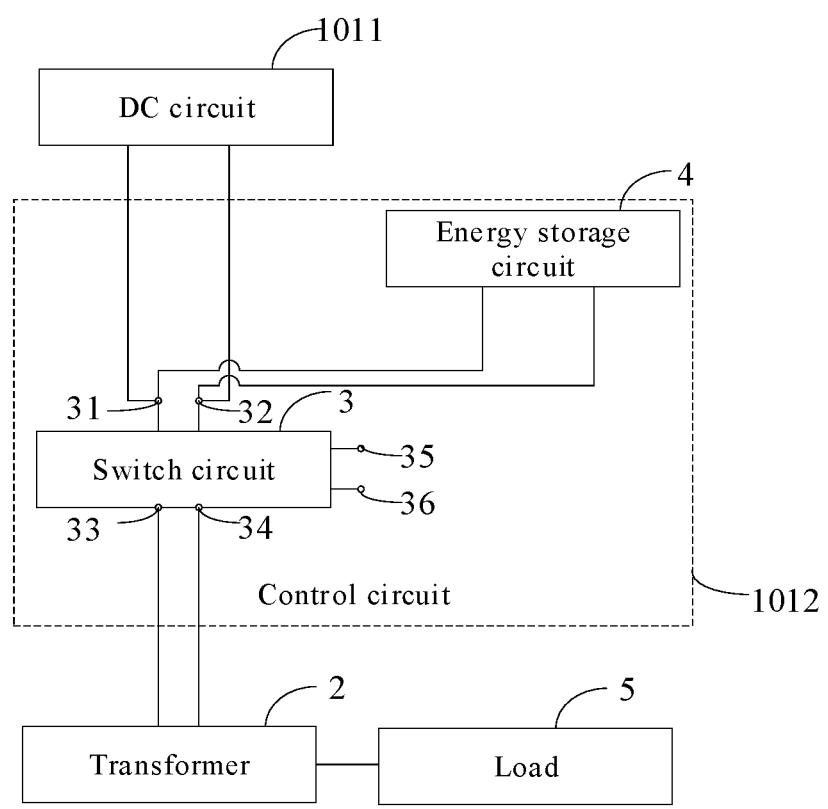
FIG. 5B is another schematic block diagram of another control circuit according to some embodiments of the present disclosure.

In some embodiments, referring to FIG. 5B, the control circuit 1012 includes a transformer 2 in addition to the embodiment shown in FIG. 5A. The transformer 2 includes a primary inductor and a secondary inductor. Two terminals of the primary inductor are connected to the third terminal 33 and the fourth terminal 34 of the switch circuit 3 respectively, and two terminals of the secondary inductor are connected to the two terminals of the load 5 for outputting the pulsed signal. The transformer 2 is configured to amplify the pulsed signal outputted from the third terminal 33 and the fourth terminal 34 of the switch circuit 3, and to apply the pulsed signal to the load 5. Because the control circuit 1012 provided by the present disclosure includes the energy storage circuit 4, when the switch circuit 3 does not output the pulsed signal, the energy storage circuit 4 stores the residual electric energy generated from the primary and secondary inductors of the transformer 2 in the switch circuit 3.

In addition, in some embodiments, to solve the problem of magnetic saturation and cut-off occurred at magnetic cores of the transformer 2 when receiving the first signal, a reverse DC signal (e.g., a reverse DC voltage or a reverse DC current) is applied to the magnetic cores of the transformer 2 when receiving the second signal, to magnetically reset the magnetic cores, thereby ensuring that the magnetic cores of the transformer 2 operates normally at the start of each pulse. A magnitude of the reverse DC signal can be set according to a length of the pulse-off time. Generally, when the pulse-off time is short, the reverse DC signal is small. In practical applications, the transformer 2 is electrically connected to an external DC power supply capable of supplying the reverse DC signal.

For illustration purpose, the transformer 2 is a step-up transformer. In practical applications, the type of the transformer can be determined according to actual needs.

Third Embodiment

Figure 6A:
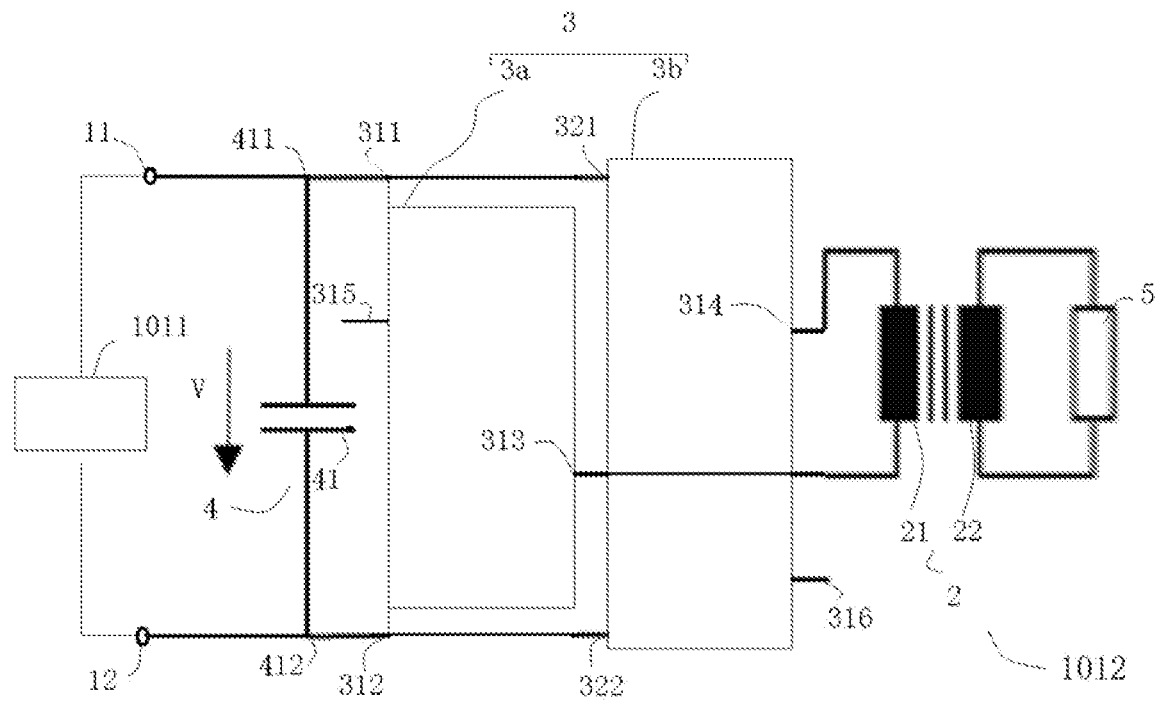
FIG. 6A is a schematic circuit diagram of another control circuit according to some embodiments of the present disclosure.

The control circuit 1012 provided by the third embodiment is based on the second embodiment. FIG. 6A is a schematic circuit diagram of another control circuit according to some embodiments of the present disclosure. In some embodiments, as shown in FIG. 6A, the switch circuit 3 includes the first switch component 3a and the second switch component 3b. The first terminal 311 and the second terminal 312 of the first switch component 3a and the first terminal 321 and the second terminal 322 of the second switch component 3b are used as the input terminals of the DC signal. For example, as shown in FIG. 6A, there are two input terminals 11 and 12. The first terminal 311 of the first switch component 3a and the first terminal 321 of the second switch component 3b are connected to the input terminal 11. The second terminal 312 of the first switch component 3a and the second terminal 322 of the second switch component 3b are connected to the input terminal 12. The two terminal of the DC circuit 1011 are connected to the input terminal 11 and 12, respectively, to apply the DC signal to the first terminal 311 and the second terminal 312 of the first switch component 3a and the first terminal 321 and the second terminal 322 of the second switch component 3b.

The third terminal 313 of the first switch component 3a and the third terminal 314 of the second switch component 3b are used as the output terminals for the pulsed signal. In some embodiments, the third terminal 313 of the first switch component 3a is connected to a second terminal of the primary inductor 21 of the transformer 2, and the third terminal 314 of the second switch component 3b is connected to a first terminal of the primary inductor 21 of the transformer 2. The two terminals of the secondary inductor 22 of the transformer 2 are connected to the two terminals of the load 5, respectively. The transformer 2 is configured to apply the pulsed signal outputted from the third terminal 313 of the first switch component 3a and the third terminal 314 of the second switch component 3b to the load 5.

Figure 6B:
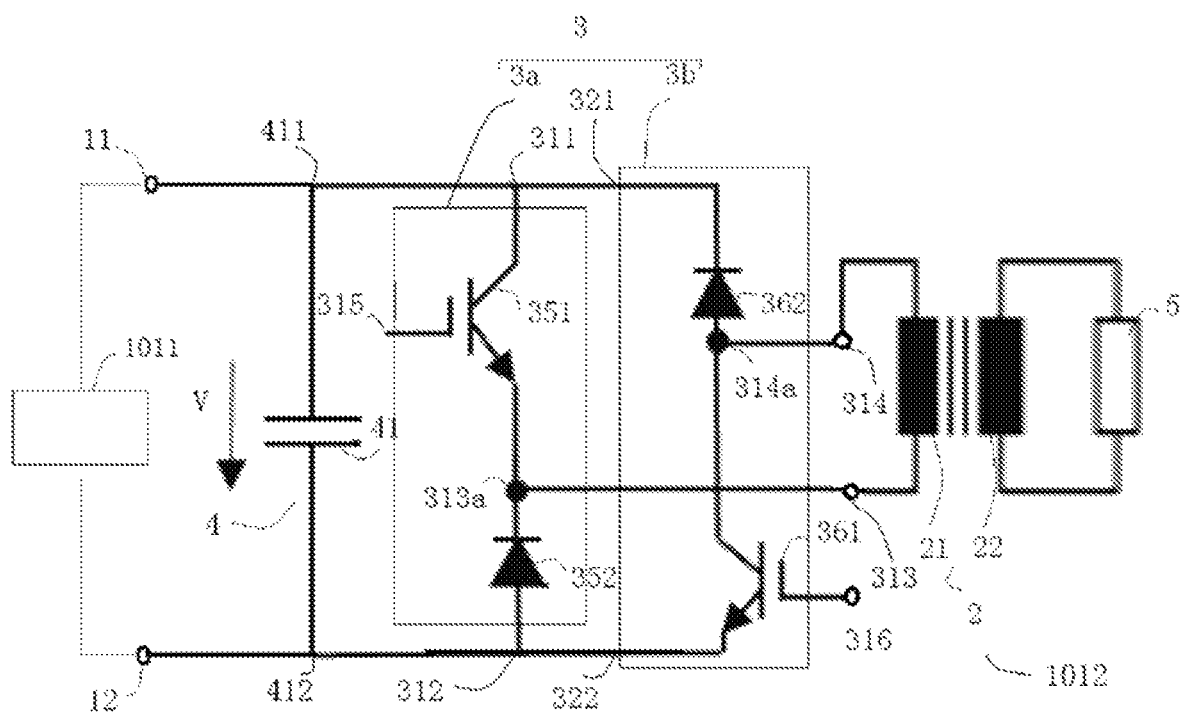
FIG. 6B is another schematic circuit diagram of another control circuit according to some embodiments of the present disclosure.

As shown in FIG. 6B, the first switch component 3a includes the first switch transistor 351 and the first cut-off diode 352. The input terminal of the first switch transistor 351 is used as the first terminal 311 of the first switch component 3a, the input terminal of the first cut-off diode 352 is used as the second terminal 312 of the first switch component 3a, and both input terminals are used as the input terminals for the DC signal. In addition, the input terminal of the first switch transistor 351 is connected to the first terminal 411 of the energy storage circuit 4. The input terminal of the first cut-off diode 352 is connected to the second terminal 412 of the energy storage circuit 4. The output terminal of the first switch transistor 351 is connected to the output terminal of the first cut-off diode 352, and both output terminals are, for example, connected to the connection point 313a shown in FIG. 6B. The output terminal drawn from the connection point 313a is used as the third terminal 313 of the first switch component 3a for outputting the pulsed signal. The control terminal of the first switch transistor 351 is used as the control terminal 315 of the first switch component 3a for receiving the first signal or the second signal.

As shown in FIG. 6B, the second switch component 3b includes the second switch transistor 361 and the second cut-off diode 362. The input terminal of the second switch transistor 361 is connected to the input terminal of the second cut-off diode 362, and both input terminals are, for example, connected to the connection point 314a shown in FIG. 6B. The output terminal drawn from the connection point 314a is used as the third terminal 314 of the second switch component 3b for outputting the pulsed signal.

The output terminal of the second switch transistor 361 is used as the second terminal 322 of the second switch component 3b, the output terminal of the second cut-off diode 362 is used as the first terminal 321 of the second switch component 3b, and both output terminals are used as the input terminals for the DC signal. The output terminal of the second switch transistor 361 is connected to the second terminal of the energy storage circuit 4, and the output terminal of the second cut-off diode 362 is connected to the first terminal 411 of the energy storage circuit 4. The control terminal of the second switch transistor 361 is used as the control terminal 316 of the second switch component 3b for receiving the first signal or the second signal.

Figure 6C:
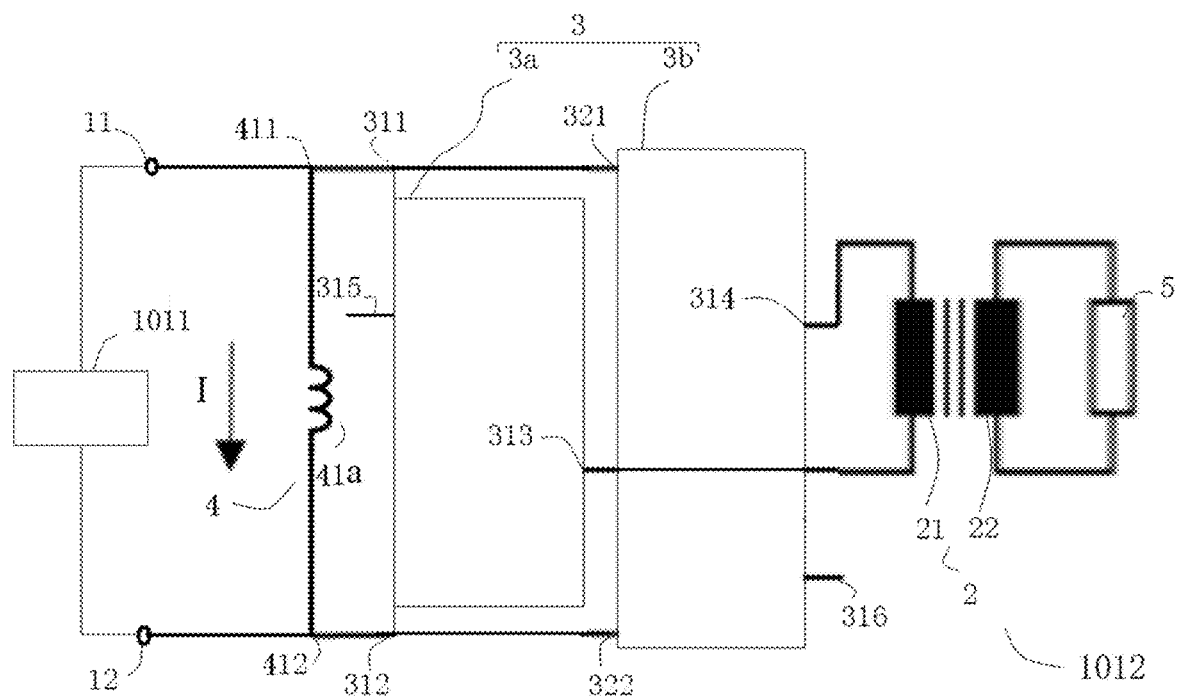
FIG. 6C is a schematic circuit diagram of another control circuit according to some embodiments of the present disclosure.
Figure 6D:
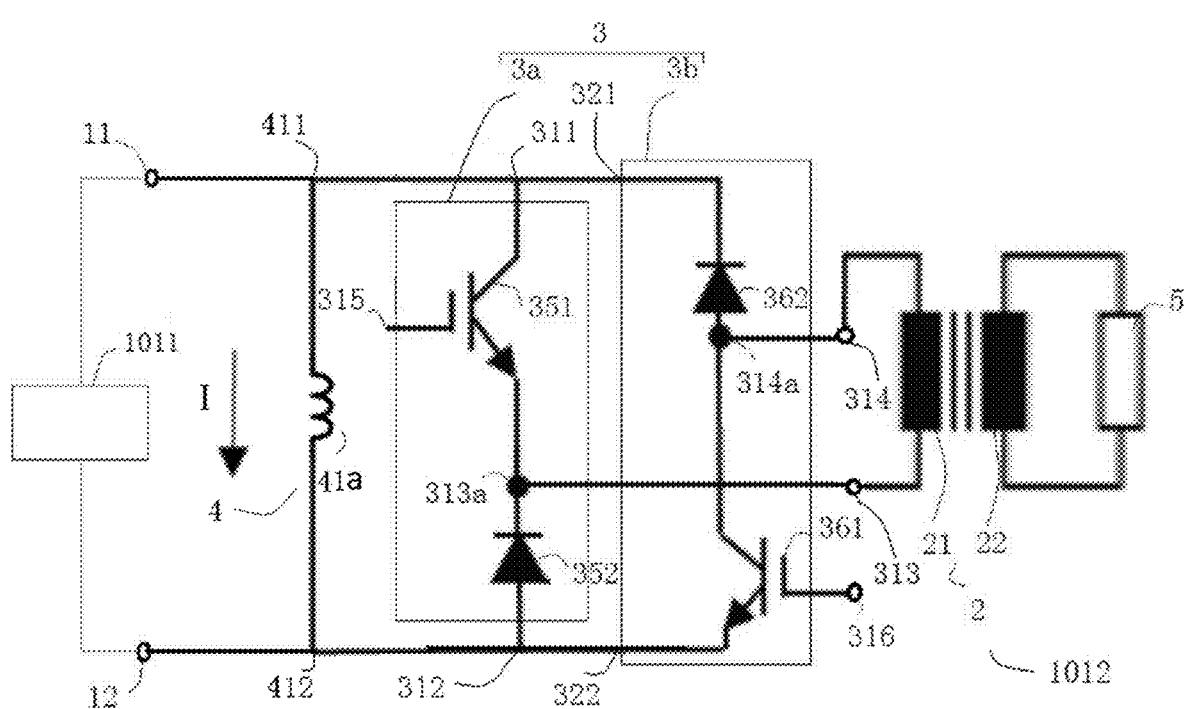
FIG. 6D is another schematic circuit diagram of another control circuit according to some embodiments of the present disclosure.

According to various embodiments of the present disclosure, the energy storage circuit may include at least one capacitor and/or at least one inductor. For example, FIGS. 6C and 6D illustrates schematic circuit diagrams of other exemplary control circuits. An exemplary inductor 41a can be used to replace the capacitor 41 illustrated in FIGS. 6A-6B, respectively.

Figure 7:
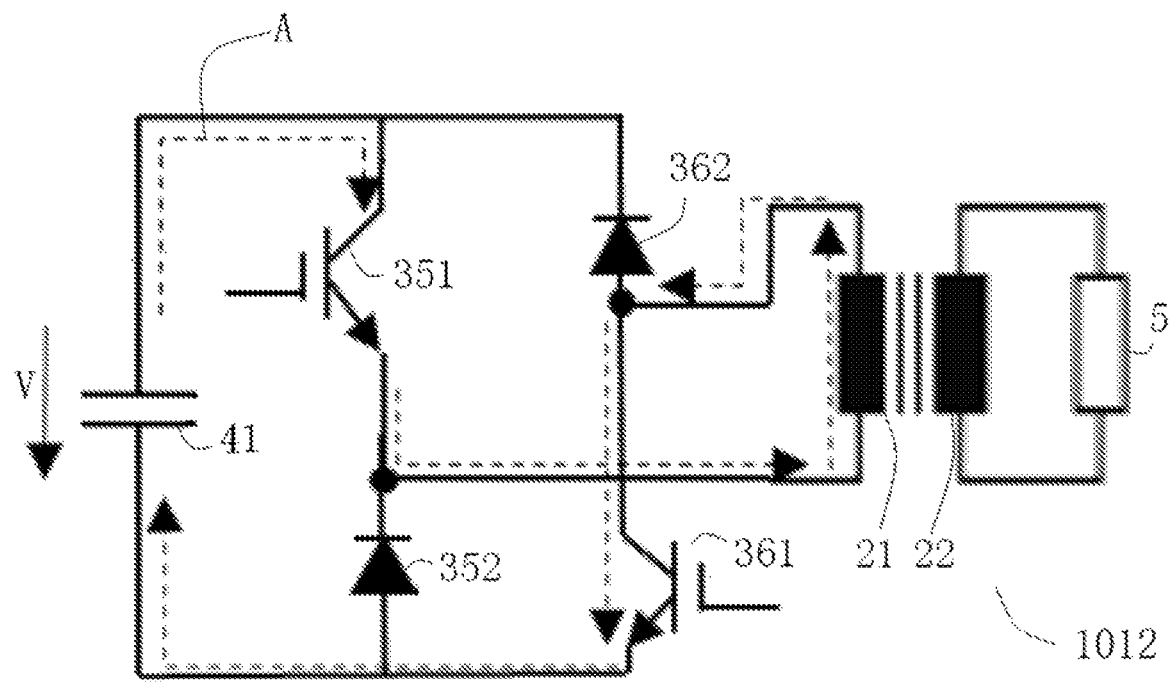
FIG. 7 is a state diagram of the control circuit when the pulse is turned on according to some embodiments of the present disclosure.

As shown in FIG. 7, when the control terminal of the first switch transistor 351 and the control terminal of the second switch transistor 361 receive the first signal, a current flow direction in the switch circuit 3 is indicated by an arrowed line A shown in FIG. 7. When the current flows in the indicated direction, the current cannot pass through the first cut-off diode 352 or the second cut-off diode 362. That is, the first cut-off diode 352 and the second cut-off diode 362 are configured to disconnect a circuit between the second terminal 412 of the energy storage circuit 4 and the third terminal 313 of the first switch component 3a. The current can pass through a circuit between the input terminal and the output terminal of the first switch transistor 351 and a circuit between the output terminal and the input terminal of the second switch transistor 361. At this point, the circuit between the second terminal 412 of the energy storage circuit 4 and the second terminal of the primary inductor 21 of the transformer 2 is disconnected. The DC signal outputted from the DC circuit 1011 passes through the transformer 2 to apply to the load 5.

Figure 8:
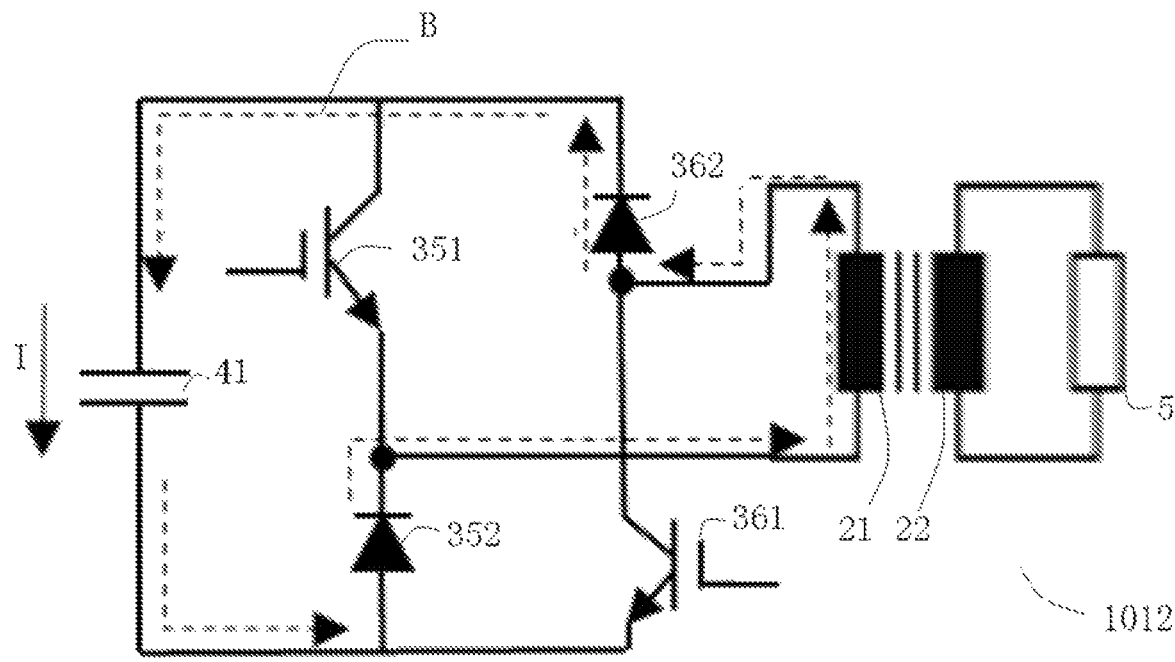
FIG. 8 is a state diagram of the control circuit when the pulse is turned off according to some embodiments of the present disclosure.

As shown in FIG. 8, when the control terminal of the first switch transistor 351 and the control terminal of the second switch transistor 361 receive the second signal, the current flow direction in the switch circuit 3 is indicated by an arrowed line B shown in FIG. 8. When the current flows in the indicated direction, the current can pass through the first cut-off diode 352 and the second cut-off diode 362. That is, the first cut-off diode 352 and the second cut-off diode 362 are configured to connect the circuit between the second terminal 412 of the energy storage circuit 4 and the third terminal 313 of the first switch component 3a. The current cannot pass through the circuit between the input terminal and the output terminal of the first switch transistor 351 or the circuit between the output terminal and the input terminal of the second switch transistor 361. At this point, the DC signal outputted from the DC circuit 1011 cannot pass through the transformer 2 to apply to the load 5. At the same time, the energy storage circuit 4 stores the residual electric energy in the switch circuit 3.

Other parts of the control circuit 1012 are similar to the first embodiment. Because the other parts have been described in detail in the first embodiment, the description thereof is omitted herein.

It should be noted that the switch circuit 3 is not limited to the structures in various embodiments of the present disclosure. In practical applications, the switch circuit 3 may also adopt other suitable structures as long as the DC signal can be outputted in the form of the pulsed signal.

The control circuit provided by the embodiments of the present disclosure can be applied to plasma immersion implantation equipment, physical vapor deposition equipment, plasma etching equipment, and the like. For example, when the plasma immersion implantation equipment is used to perform an ultra-shallow junction fabrication at technical structures below 14 nm or 10 nm, ion implantation having low energy and high dosage is required, and accurate control of the ion implantation is needed. Because the oscillation of the voltage at the end of each pulse is reduced, the control circuit provided by the present disclosure facilitates a desired pulse waveform. Thus, not only the requirement for the ion implantation having the low energy and the high dosage can be satisfied, but also the plasma energy and density used in the semiconductor processes can be accurately controlled.

In the embodiments of the present disclosure, the switch circuit in the control circuit outputs the pulsed signal in response to the first control terminal and the second control terminal receiving the first signal, and stops outputting the pulsed signal in response to the first control terminal and the second control terminal receiving the second signal, thereby achieving outputting the DC signal in the form of the pulsed signal. At the same time, when the switch circuit does not output the pulsed signal, the energy storage circuit stores the residual electric energy of the switch circuit. Thus, the time period for the residual electric energy to continue to circulate in the switch circuit is reduced, the oscillation of the voltage at the end of each pulse is reduced, and the plasma energy and density used in the semiconductor processes can be accurately controlled.

Figure 9:
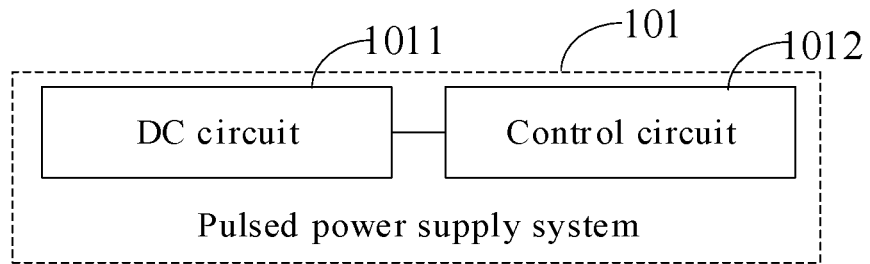
FIG. 9 is a schematic block diagram of a pulsed power system according to some embodiments of the present disclosure.

Another aspect of the present disclosure provides a pulsed power supply system 101 as shown in FIG. 9. The pulsed power supply system 101 includes a DC circuit 1011 and a disclosed control circuit 1012. The DC circuit 1011 is configured to apply the DC signal to the first terminal 31 and the second terminal 32 of the switch circuit. The control circuit 1012 is similar to the previously described embodiments, and the description thereof is omitted.

In some embodiments, the DC circuit 1011 includes a DC power supply configured to output the DC signal, for example, a DC voltage signal or a DC current signal.

The pulsed power supply system provided by the present disclosure stores the residual electric energy in the switch circuit through the control circuit, thereby reducing the oscillation of the voltage at the end of each pulse and improving the control accuracy of the plasma energy and density used in the semiconductor processes.

Another aspect of the present disclosure provides a semiconductor processing equipment. The semiconductor equipment includes an upper electrode assembly, a lower electrode assembly, and at least one disclosed pulsed power supply system configured to supply the pulsed signal to at least one of the upper electrode assembly or the lower electrode assembly. The upper electrode assembly includes, but is not limited to, an upper electrode plate, a shower plate, and an inductor coil, etc. The lower electrode assembly includes, but is not limited to, an electrostatic chuck, etc.

Through the disclosed pulsed power supply system, the semiconductor processing equipment provided by the present disclosure outputs the DC signal in the form of the pulsed signal and stores the residual electric energy of the switch circuit, thereby reducing the oscillation of the voltage at the end of each pulse and improving the control accuracy of the plasma energy and density used in the semiconductor processes.

In practical applications, the semiconductor processing equipment may include plasma immersion implantation equipment, physical vapor deposition equipment, plasma etching equipment, and the like.

Three embodiments of the semiconductor processing equipment consistent with the present disclosure will be described in detail below.

First Embodiment

Figure 10A:
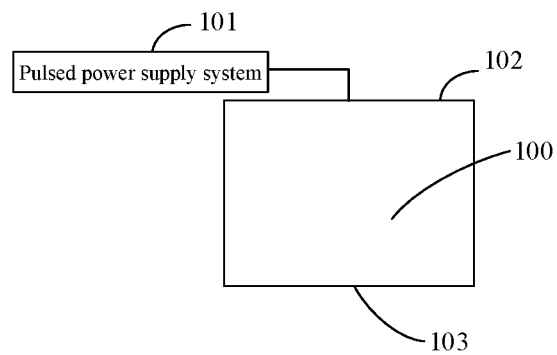
FIG. 10A is a schematic block diagram of a semiconductor processing equipment according to some embodiments of the present disclosure.

FIG. 10A is a schematic block diagram of a semiconductor processing equipment according to some embodiments of the present disclosure. As shown in FIG. 10A, the semiconductor processing equipment includes a reaction chamber 100, an upper electrode assembly 102, a lower electrode assembly 103, and a pulsed power supply system 101 connected to the upper electrode assembly 102 to supply the pulsed signal to the upper electrode assembly 102. The pulsed power supply system 101 is provided by the present disclosure.

Through the pulsed power supply system 101, the semiconductor processing equipment provided by the present disclosure outputs the DC signal in the form of the pulsed signal to the upper electrode assembly 102 and stores the residual electric energy of the switch circuit in the upper electrode assembly 102, thereby reducing the oscillation of the voltage applied to the upper electrode assembly 102 at the end of each pulse and improving the control accuracy of the plasma energy and density used in the semiconductor processes.

In practical applications, the semiconductor processing equipment may include plasma immersion implantation equipment, physical vapor deposition equipment, plasma etching equipment, and the like.

Second Embodiment

Figure 10B:
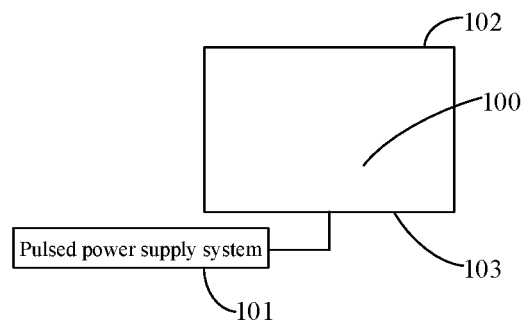
FIG. 10B is a schematic block diagram of another semiconductor processing equipment according to some embodiments of the present disclosure.

FIG. 10B is a schematic block diagram of another semiconductor processing equipment according to some embodiments of the present disclosure. As shown in FIG. 10B, the semiconductor processing equipment includes a reaction chamber 100, an upper electrode assembly 102, a lower electrode assembly 103, and a pulsed power supply system 101 connected to the lower electrode assembly 103 to supply the pulsed signal to the lower electrode assembly 103. The pulsed power supply system 101 is provided by the present disclosure.

Through the pulsed power supply system 101, the semiconductor processing equipment provided by the present disclosure outputs the DC signal in the form of the pulsed signal to the lower electrode assembly 103 and stores the residual electric energy of the switch circuit in the lower electrode assembly 103, thereby reducing the oscillation of the voltage applied to the lower electrode assembly 103 at the end of each pulse and improving the control accuracy of the plasma energy and density used in the semiconductor processes.

In practical applications, the semiconductor processing equipment may include plasma immersion implantation equipment, physical vapor deposition equipment, plasma etching equipment, and the like.

Third Embodiment

Figure 10C:
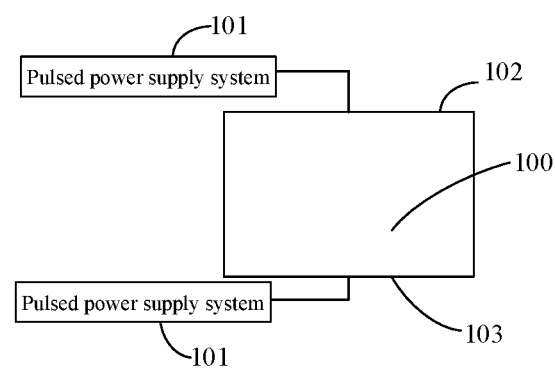
FIG. 10C is a schematic block diagram of another semiconductor processing equipment according to some embodiments of the present disclosure.

FIG. 10C is a schematic block diagram of another semiconductor processing equipment according to some embodiments of the present disclosure. As shown in FIG. 10C, the semiconductor processing equipment includes a reaction chamber 100, an upper electrode assembly 102, a lower electrode assembly 103, and two pulsed power supply system 101 connected to the upper electrode assembly 102 and the lower electrode assembly 103 respectively to supply the pulsed signal to the upper electrode assembly 102 and the lower electrode assembly 103 respectively. The two pulsed power supply system 101 are provided by the present disclosure.

Through the two pulsed power supply system 101, the semiconductor processing equipment provided by the present disclosure outputs the DC signal in the form of the pulsed signal to the upper electrode assembly 102 and the lower electrode assembly 103 respectively and stores the residual electric energy of the switch circuit in the upper electrode assembly 102 and the lower electrode assembly 103, thereby reducing the oscillation of the voltages applied to the upper electrode assembly 102 and the lower electrode assembly 103 at the end of each pulse and improving the control accuracy of the plasma energy and density used in the semiconductor processes.

In practical applications, the semiconductor processing equipment may include plasma immersion implantation equipment, physical vapor deposition equipment, plasma etching equipment, and the like.

Although the present disclosure has been described in detail above with general description and specific embodiments, some modifications or improvements can be made on the basis of the present disclosure, which will be obvious to those skilled in the art. Therefore, these modifications or improvements made without departing from the spirit of the present disclosure fall within the scope of the claimed protection of the present disclosure.

What is claimed is:
1. A control circuit for outputting a direct current (DC) signal in the form of a pulsed signal, comprising:
    a switch circuit having a first terminal, a second terminal, a third terminal, a fourth terminal, a first control terminal, and a second control terminal, wherein
        the first terminal and the second terminal are input terminals of the DC signal,
        the third terminal and the fourth terminal are output terminals of the pulsed signal,
        the first control terminal being a gate control terminal of a first switch component, and the second control terminal being a gate control terminal of a second switch component, the gate control terminal of the first switch component and the gate control terminal of the second switch component are physically connected to a control component to receive a first signal or a second signal sent from the control component to control outputting the pulsed signal, in response to the first control terminal and the second control terminal receiving the first signal, the third terminal and the fourth terminal output the pulsed signal, and in response to the first control terminal and the second control terminal receiving the second signal, the third terminal and the fourth terminal stop outputting the pulsed signal; and an energy storage circuit having two terminals connected to the first terminal and the second terminal of the switch circuit and configured to suppress voltage oscillations in the pulsed signal, such that a maximum voltage during a voltage oscillation time period is smaller than 10% of a normal voltage of the pulsed signal, the voltage oscillation time period is less than 1 µs, and a falling edge time period of the pulsed signal is less than 1 µs.

2. The control circuit according to claim 1, wherein:

a first terminal and a second terminal of the first switch component and a first terminal and a second terminal of the second switch component are used as the input terminals for the DC signal;

the first terminal of the first switch component is connected to the first terminal of the energy storage circuit and the first terminal of the second switch component, respectively;

the second terminal of the first switch component is connected to the second terminal of the energy storage circuit and the second terminal of the second switch component, respectively;

a third terminal of the first switch component and a third terminal of the second switch component are used for outputting the pulsed signal;

in response to the gate control terminal of the first switch component receiving the first signal, the first switch component is configured to turn on a circuit between the first terminal of the first switch component and the third terminal of the first switch component, and to turn off a circuit between a second terminal of the energy storage circuit and the third terminal of the first switch component;

in response to the gate control terminal of the first switch component receiving the second signal, the first switch component is configured to turn off the circuit between the first terminal of the first switch component and the third terminal of the first switch component, and to turn on the circuit between the second terminal of the energy storage circuit and the third terminal of the first switch component;

in response to the gate control terminal of the second switch component receiving the first signal, the second switch component is configured to turn on a circuit between the second terminal of the second switch component and the third terminal of the second switch component, and to turn off a circuit between a first terminal of the energy storage circuit and the third terminal of the second switch component; and in response to the gate control terminal of the second switch component receiving the second signal, the second switch component is configured to turn off the circuit between the second terminal of the second switch component and the third terminal of the second switch component, and to turn on the circuit between the first terminal of the energy storage circuit and the third terminal of the second switch component.

3. The control circuit according to claim 2, wherein:

the first switch component includes a first switch transistor and a first cut-off diode;

an input terminal of the first switch transistor and an input terminal of the first cut-off diode are used as the input terminals for the DC signal;

the input terminal of the first switch transistor is connected to the first terminal of the energy storage circuit;

the input terminal of the first cut-off diode is connected to the second terminal of the energy storage circuit;

an output terminal of the first switch transistor is connected to an output terminal of the first cut-off diode for outputting the pulsed signal;

a control terminal of the first switch transistor is configured to receive the first signal or the second signal;

in response to the control terminal of the first switch transistor receiving the first signal, the first switch transistor is configured to turn on a circuit between the input terminal and the output terminal of the first switch transistor, and the first cut-off diode is configured to turn off a circuit between the second terminal of the energy storage circuit and the output terminal of the first cut-off diode; and in response to the control terminal of the first switch transistor receiving the second signal, the first switch transistor is configured to turn off the circuit between the input terminal and the output terminal of the first switch transistor, and the first cut-off diode is configured to turn on the circuit between the second terminal of the energy storage circuit and the output terminal of the first cut-off diode.

4. The control circuit according to claim 3, wherein:

material used for the first switch transistor includes any one of Si, SiC, GaN, and AlGaN.

5. The control circuit according to claim 2, wherein:

the second switch component includes a second switch transistor and a second cut-off diode;

an input terminal of the second switch transistor is connected to an input terminal of the second cut-off diode for outputting the pulsed signal;

an output terminal of the second switch transistor and an output terminal of the second cut-off diode are used as the input terminals for the DC signal;

the output terminal of the second switch transistor is connected to the second terminal of the energy storage circuit;

the output terminal of the second cut-off diode is connected to the first terminal of the energy storage circuit;

a control terminal of the second switch transistor is configured to receive the first signal or the second signal;

in response to the control terminal of the second switch transistor receiving the first signal, the second switch transistor is configured to turn on a circuit between the input terminal and the output terminal of the second switch transistor, and the second cut-off diode is configured to turn off a circuit between the first terminal of the energy storage circuit and the output terminal of the second cut-off diode; and in response to the control terminal of the second switch transistor receiving the second signal, the second switch transistor is configured to turn off the circuit between the input terminal and the output terminal of the second switch transistor, and the second cut-off diode is configured to turn on the circuit between the first terminal of the energy storage circuit and the output terminal of the second cut-off diode.

6. The control circuit according to claim 5, wherein:
material used for the second switch transistor includes any one of Si, SiC, GaN, and AlGaN.

7. The control circuit according to claim 1, wherein:
the energy storage circuit includes at least one capacitor or at least one inductor;
one terminal of the at least one capacitor or the at least one inductor is used as the first terminal of the energy storage circuit to connect to the first terminal of the switch circuit; and
another terminal of the at least one capacitor or the at least one inductor is used as the second terminal of the energy storage circuit to connect to the second terminal of the switch circuit.

8. The control circuit according to claim 1, further comprising:
a transformer including a primary inductor and a secondary inductor, wherein two terminals of the primary inductor are connected to the third terminal and the fourth terminal of the switch circuit, respectively, and two terminals of the secondary inductor are configured to output the pulsed signal, a reverse DC signal is applied to magnetic cores of the transformer when receiving the second signal to magnetically reset the magnetic cores, such that magnetic saturation and cut-off at the magnetic cores of the transformer are prevented at the start of each pulse.

9. A pulsed power supply system, comprising:
a DC circuit; and
a control circuit,
wherein the DC circuit is configured to supply a DC signal to a first terminal and a second terminal of a switch circuit, and the control circuit includes:
the switch circuit having the first terminal, the second terminal, a third terminal, a fourth terminal, a first control terminal, and a second control terminal, wherein
the first terminal and the second terminal are input terminals of the DC signal,
the third terminal and the fourth terminal are output terminals of a pulsed signal,
the first control terminal being a gate control terminal of a first switch component, and the second control terminal being a gate control terminal of a second switch component, the gate control terminal of the first switch component and the gate control terminal of the second switch component are physically connected to a control component to receive a first signal or a second signal sent from the control component to control outputting the pulsed signal, in response to the first gate control terminal and the second gate control terminal receiving the first signal, the third terminal and the fourth terminal output the pulsed signal, and
in response to the first gate control terminal and the second gate control terminal receiving the second signal, the third terminal and the fourth terminal stop outputting the pulsed signal; and
an energy storage circuit having two terminals connected to the first terminal and the second terminal of the switch circuit and configured to suppress voltage oscillations in the pulsed signal, such that a maximum voltage during a voltage oscillation time period is smaller than 10% of a normal voltage of the pulsed signal, the voltage oscillation time period is less than 1 μs, and a falling edge time period of the pulsed signal is less than 1 μs.

10. The pulsed power supply system according to claim 9, wherein the DC circuit includes a DC power supply.

11. Semiconductor processing equipment, comprising:
an upper electrode assembly and a lower electrode assembly, configured for generating plasma in a reaction chamber; and
at least one pulsed power supply system, connected to at least one of the upper electrode assembly or the lower electrode assembly;
wherein the at least one pulsed power supply system includes a DC circuit and a control circuit, the DC circuit is configured to supply a DC signal to a first terminal and a second terminal of a switch circuit, and the control circuit includes:
the switch circuit having the first terminal, the second terminal, a third terminal, a fourth terminal, a first control terminal, and a second control terminal, wherein
the first terminal and the second terminal are input terminals of the DC signal,
the third terminal and the fourth terminal are output terminals of a pulsed signal,
the first control terminal and the second control terminal are connected to a control component to receive a first signal or a second signal sent from the control component to control outputting the pulsed signal,
in response to the first control terminal and the second control terminal receiving the first signal, the third terminal and the fourth terminal output the pulsed signal, and
in response to the first control terminal and the second control terminal receiving the second signal, the third terminal and the fourth terminal stop outputting the pulsed signal; and
an energy storage circuit having two terminals connected to the first terminal and the second terminal of the switch circuit and configured to suppress voltage oscillations in the pulsed signal, such that a maximum voltage during a voltage oscillation time period is smaller than 10% of a normal voltage of the pulsed signal, the voltage oscillation time period is less than 1 μs, and a falling edge time period of the pulsed signal is less than 1 μs.

12. The semiconductor processing equipment according to claim 11, wherein:
the semiconductor processing equipment includes plasma immersion implantation equipment, physical vapor deposition equipment, or plasma etching equipment.

13. The semiconductor processing equipment according to claim 11, wherein:
the switch circuit includes a first switch component and second switch component;
a first terminal and a second terminal of the first switch component and a first terminal and a second terminal of the second switch component are used as input terminals for the DC signal;
the first terminal of the first switch component is connected to the first terminal of the energy storage circuit and the first terminal of the second switch component, respectively;
the second terminal of the first switch component is connected to the second terminal of the energy storage circuit and the second terminal of the second switch component, respectively;

a control terminal of the first switch component and a control terminal of the second switch component are configured to receive the first signal or the second signal;

a third terminal of the first switch component and a third terminal of the second switch component are used for outputting the pulsed signal;

in response to the control terminal of the first switch component receiving the first signal, the first switch component is configured to turn on a circuit between the first terminal of the first switch component and the third terminal of the first switch component, and to turn off a circuit between a second terminal of the energy storage circuit and the third terminal of the first switch component;

in response to the control terminal of the first switch component receiving the second signal, the first switch component is configured to turn off the circuit between the first terminal of the first switch component and the third terminal of the first switch component, and to turn on the circuit between the second terminal of the energy storage circuit and the third terminal of the first switch component;

in response to the control terminal of the second switch component receiving the first signal, the second switch component is configured to turn on a circuit between the second terminal of the second switch component and the third terminal of the second switch component, and to turn off a circuit between a first terminal of the energy storage circuit and the third terminal of the second switch component; and in response to the control terminal of the second switch component receiving the second signal, the second switch component is configured to turn off the circuit between the second terminal of the second switch component and the third terminal of the second switch component, and to turn on the circuit between the first terminal of the energy storage circuit and the third terminal of the second switch component.

14. The semiconductor processing equipment according to claim 13, wherein:

the first switch component includes a first switch transistor and a first cut-off diode;

an input terminal of the first switch transistor and an input terminal of the first cut-off diode are used as the input terminals for the DC signal;

the input terminal of the first switch transistor is connected to the first terminal of the energy storage circuit;

the input terminal of the first cut-off diode is connected to the second terminal of the energy storage circuit;

an output terminal of the first switch transistor is connected to an output terminal of the first cut-off diode for outputting the pulsed signal;

a control terminal of the first switch transistor is configured to receive the first signal or the second signal;

in response to the control terminal of the first switch transistor receiving the first signal, the first switch transistor is configured to turn on a circuit between the input terminal and the output terminal of the first switch transistor, and the first cut-off diode is configured to turn off a circuit between the second terminal of the energy storage circuit and the output terminal of the first cut-off diode; and in response to the control terminal of the first switch transistor receiving the second signal, the first switch transistor is configured to turn off the circuit between the input terminal and the output terminal of the first switch transistor, and the first cut-off diode is configured to turn on the circuit between the second terminal of the energy storage circuit and the output terminal of the first cut-off diode.

15. The semiconductor processing equipment according to claim 14, wherein:

material used for the first switch transistor includes any one of Si, SiC, GaN, and AlGaN.

16. The semiconductor processing equipment according to claim 13, wherein:

the second switch component includes a second switch transistor and a second cut-off diode;

an input terminal of the second switch transistor is connected to an input terminal of the second cut-off diode for outputting the pulsed signal;

an output terminal of the second switch transistor and an output terminal of the second cut-off diode are used as the input terminals for the DC signal;

the output terminal of the second switch transistor is connected to the second terminal of the energy storage circuit;

the output terminal of the second cut-off diode is connected to the first terminal of the energy storage circuit;

a control terminal of the second switch transistor is configured to receive the first signal or the second signal;

in response to the control terminal of the second switch transistor receiving the first signal, the second switch transistor is configured to turn on a circuit between the input terminal and the output terminal of the second switch transistor, and the second cut-off diode is configured to turn off a circuit between the first terminal of the energy storage circuit and the output terminal of the second cut-off diode; and in response to the control terminal of the second switch transistor receiving the second signal, the second switch transistor is configured to turn off the circuit between the input terminal and the output terminal of the second switch transistor, and the second cut-off diode is configured to turn on the circuit between the first terminal of the energy storage circuit and the output terminal of the second cut-off diode.

17. The semiconductor processing equipment according to claim 16, wherein:

material used for the second switch transistor includes any one of Si, SiC, GaN, and AlGaN.

18. The semiconductor processing equipment according to claim 11, wherein:

the energy storage circuit includes at least one capacitor or the at least one inductor;

one terminal of the at least one capacitor or the at least one inductor is used as the first terminal of the energy storage circuit to connect to the first terminal of the switch circuit; and another terminal of the at least one capacitor or the at least one inductor is used as the second terminal of the energy storage circuit to connect to the second terminal of the switch circuit.

19. The semiconductor processing equipment according to claim 11, wherein the control circuit further includes:

a transformer including a primary inductor and a secondary inductor, wherein two terminals of the primary inductor are connected to the third terminal and the fourth terminal of the switch circuit, respectively, and two terminals of the secondary inductor are configured to output the pulsed signal, a reverse DC signal is applied to magnetic cores of the transformer when receiving the second signal to magnetically reset the magnetic cores, such that magnetic saturation and cut-off at the magnetic cores of the transformer are prevented at the start of each pulse.

\* \* \* \* \*